(12) United States Patent
Hsieh et al.

(10) Patent No.: US 9,806,071 B2
(45) Date of Patent: Oct. 31, 2017

(54) INTEGRATED CIRCUIT WITH ELONGATED COUPLING

(71) Applicant: Taiwan Semiconductor Manufacturing Company, Ltd., Hsin-Chu (TW)

(72) Inventors: Tung-Heng Hsieh, Zhoudong Town (TW); Hui-Zhong Zhuang, Kaohsiung (TW); Chung-Te Lin, Tainan (TW); Ting-Wei Chiang, New Taipei (TW); Sheng-Hsiung Wang, Zhubei (TW); Li-Chun Tien, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/243,787

(22) Filed: Aug. 22, 2016

(65) Prior Publication Data

US 2016/0358902 A1    Dec. 8, 2016

Related U.S. Application Data

(63) Continuation of application No. 14/610,294, filed on Jan. 30, 2015, now Pat. No. 9,425,141.

(Continued)

(51) Int. Cl.
*H01L 23/48* (2006.01)
*H01L 27/02* (2006.01)
(Continued)

(52) U.S. Cl.
CPC ........ *H01L 27/0207* (2013.01); *H01L 23/528* (2013.01); *H01L 23/5226* (2013.01);
(Continued)

(58) Field of Classification Search
CPC ............. H01L 27/0207; H01L 23/5226; H01L 23/528; H01L 23/5283; H01L 23/5286; H01L 23/53271
(Continued)

(56) References Cited

U.S. PATENT DOCUMENTS 8,421,205 B2    4/2013  Yang
8,661,389 B2    2/2014  Chern et al.
(Continued)

FOREIGN PATENT DOCUMENTS

JP    2002329783 A    11/2002
JP    2014011389 A    1/2014
(Continued)

*Primary Examiner* — Tu-Tu Ho
(74) *Attorney, Agent, or Firm* — Slater Matsil, LLP

(57) ABSTRACT

An integrated circuit comprises a first layer on a first level. The first layer comprises a set of first lines. The first lines each have a length and a width. The length of each of the first lines is greater than the width. The integrated circuit also comprises a second layer on a second level different from the first level. The second layer comprises a set of second lines. The second lines each have a length and a width. The length of each of the second lines is greater than the width. The integrated circuit further comprises a coupling configured to connect at least one first line of the set of first lines with at least one second line of the set of second lines. The coupling has a length and a width. The set of second lines has a pitch measured between the lines of the set of second lines in the first direction. The length of the first coupling is greater than or equal to the pitch.

20 Claims, 7 Drawing Sheets

Related U.S. Application Data

(60) Provisional application No. 62/061,995, filed on Oct. 9, 2014.

(51) Int. Cl.
  *H01L 23/522* (2006.01)
  *H01L 23/528* (2006.01)
  *H01L 23/532* (2006.01)

(52) U.S. Cl.
  CPC ...... *H01L 23/5283* (2013.01); *H01L 23/5286* (2013.01); *H01L 23/53271* (2013.01); *H01L 2924/0002* (2013.01)

(58) Field of Classification Search
  USPC .......................................................... 257/741
  See application file for complete search history.

(56) References Cited

U.S. PATENT DOCUMENTS

| | | | |
|---|---|---|---|
| 8,698,205 B2 | 4/2014 | Tzeng et al. | |
| 8,826,212 B2 | 9/2014 | Yeh et al. | |
| 8,836,141 B2 | 9/2014 | Chi et al. | |
| 2002/0162079 A1 | 10/2002 | Igarashi et al. | |
| 2004/0210862 A1 | 10/2004 | Igarashi et al. | |
| 2009/0184758 A1* | 7/2009 | Motomura | H01L 27/092 327/544 |
| 2012/0293496 A1 | 11/2012 | Park et al. | |
| 2013/0201760 A1 | 8/2013 | Dong et al. | |
| 2014/0001544 A1 | 1/2014 | Sato et al. | |
| 2014/0215420 A1 | 7/2014 | Lin et al. | |
| 2014/0264924 A1 | 9/2014 | Yu et al. | |
| 2014/0282289 A1 | 9/2014 | Hsu et al. | |
| 2014/0325466 A1 | 10/2014 | Ke et al. | |

FOREIGN PATENT DOCUMENTS

| | | |
|---|---|---|
| KR | 1020120129704 A | 11/2012 |
| KR | 1020140120366 A | 10/2014 |

* cited by examiner

INTEGRATED CIRCUIT WITH ELONGATED COUPLING

PRIORITY CLAIM AND CROSS-REFERENCE

This application is a continuation of U.S. patent application Ser. No. 14/610,294, filed on Jan. 30, 2015, and entitled "Integrated Circuit with Elongated Coupling" which claims priority to U.S. Provisional Patent Application No. 62/061,995 filed Oct. 9, 2014, which application is incorporated herein by reference.

BACKGROUND

Some integrated circuits are manufactured having multiple layers that are coupled by vias between the coupled layers. The vias in integrated circuits are usually circular or square-shaped in cross-section. Vias generally have cross-sectional areas that are relatively small compared to cross-sectional areas in parallel planes of the layers that are coupled by the vias. The dimensions and shapes of the vias in an integrated circuit often affect circuit performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
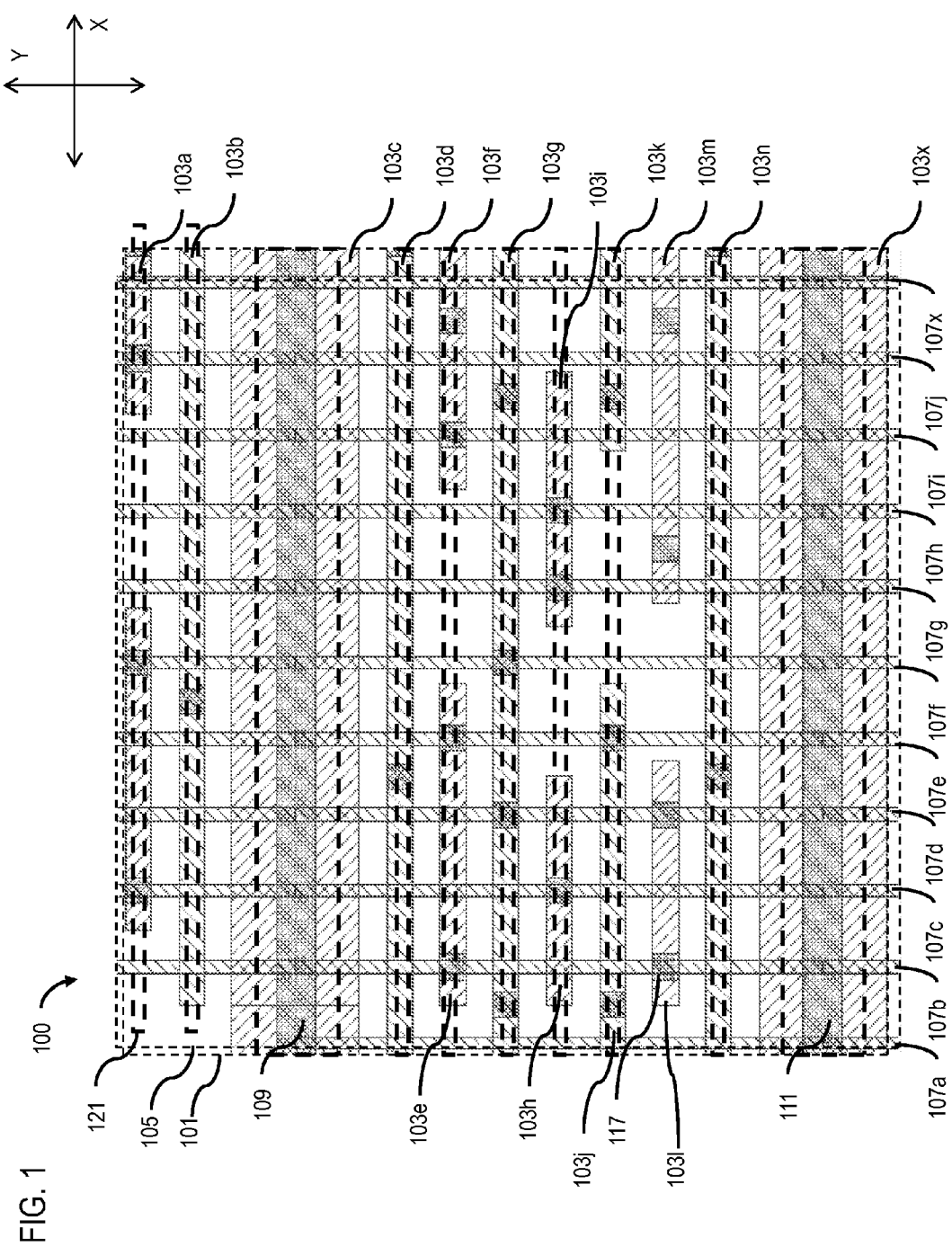
FIG. 1 is a plan view of an integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated circuits are manufactured having multiple layers that are coupled with one another by vias for electrical and/or thermal conductive purposes, for example. Some layers within an integrated circuit are manufactured in compliance with one or more design rules that dictate dimensions or direction constraints with which a designed or manufactured integrated circuit should adhere. The vias that couple layers in integrated circuits are between the coupled layers and are usually circular or square-shaped in cross-section. Vias generally have cross-sectional areas that are small compared to the cross-sectional areas of the layers that are coupled by the vias. Such sizes and shapes of the vias m a typical integrated circuit often affect circuit performance. For example, a via having a cross-sectional area that is small compared to a cross-sectional area of a layer that the via contacts, limits electromigration performance and/or heat transfer performance between the layers coupled by such a via.

An integrated circuit according to one or more embodiments has elongated couplings such as vias that connect layers or lines of layers.

FIG. 1 is a plan view of an integrated circuit 100, in accordance with one or more embodiments. Integrated circuit 100 includes a first layer 101 on a first level. In some embodiments, the first layer 101 is a metal. The first layer 101 comprises a set of first lines 103a-103x (collectively referred to as first line(s) 103). The first lines 103 each have a length measured in a first direction X and a width measured in a second direction Y. The second direction Y is different from the first direction X. In some embodiments, first direction X is orthogonal to second direction Y. The length of each of the first lines 103 is greater than the width of each of the first lines 103. The length and/or width of each of the first lines 103 varies among the first lines 103. In some embodiments, the length and/or width of each of the first lines 103 is uniform among the first lines 103.

A second layer 105 is on a second level different from the first level. In some embodiments, the first layer 101 is over the second layer 105. In other embodiments, the second layer 105 is over the first layer 101. In some embodiments, the second layer 105 is a polysilicon layer. The second layer 105 comprises a set of second lines 107a-107x (collectively referred to as second line(s) 107). The second lines 107 each have a length measured in the second direction Y and a width measured in the first direction X. The length of each of the second lines 107 is greater than the width of each of the second lines 107. The length and/or width of each of the second lines 107 varies among the second lines 107. For example, second line 107a has a length that is shorter than the other second lines 107. In some embodiments, the length and/or width of each of the second lines 107 is uniform among the second lines 107. For example, second line 107a, in some embodiments, has a length that is equal to the other second lines 107, but is off set from the other second lines 107 in the second direction Y. Alternatively, the second line 107a, in some embodiments, has a length that is equal to the other second lines 107, and the ends of the second lines 107 are aligned in the second direction X.

A first coupling 109 connects at least one first line 103 of the set of first lines 103 with at least one second line 107 of the set of second lines 107. For example, first coupling 109 is configured to connect first line 103c with second line 107a. The first coupling 109 has a length measured in the first direction X and a width measured in the second direction Y. The length of the first coupling 109 is greater than the width of the first coupling 109. The first coupling 109 is at least on a third level different from the first level and the second level. In some embodiments, the third level is between the first level and the second level. As such, the first coupling 109 is between the first layer 101 and the second layer 105.

A second coupling 111 connects at least one other first line 103 of the set of first lines 103 with the at least one second line 107 of the set of second lines 107. For example, the second coupling 111 connects first line 103x with second line 107a. The second coupling 111 has a length measured in the first direction X and a width measured in the second direction Y. The length of the second coupling 111 is greater than the width of the second coupling 111. The second coupling 111 is at least on the third level. As such, the second coupling 111 is between the first layer 101 and the second layer 105.

First line 103c is a source power rail and first line 103x is a drain power rail. The first coupling 109 is in direct contact with the source power rail 103c and the second coupling 111 is in direct contact with the drain power rail 103x. Source power rail 103c and drain power rail 103x have widths that are greater than the other first lines 103. In some embodiments, the source power rail 103c and the drain power rail 103x have widths that are equal to the widths of the other first lines 103. In other embodiments, the source power rail 103c and the drain power rail 103x have widths that are less than the other first lines 103.

The set of second lines 107 has a pitch or distance measured between the second lines 107 in the first direction X. The length of the first coupling 109 and the second coupling 111 is greater than or equal to the pitch between the second lines 107. The first coupling 109 and/or the second coupling 111 is a continuous bar that extends parallel to source power rail 103c or drain power rail 103x across the integrated circuit 100 connecting the second lines 107 with the source power rail 103c or the drain power rail 103x. In some embodiments, the first coupling 109 and/or the second coupling 111 is a series of segments that have lengths that are greater than the pitch of the second lines 107. In some embodiments, the first coupling 109 and the second coupling 111 are vias. The first coupling 109 and the second coupling 111 are one or more of a metal or a poly silicon material.

One or more third couplings 117 connect one or more first lines 103, other than the source power rail 103c and the drain power rail 103x, with one or more second lines 107 or with another feature or layer of the integrated circuit 100. The one or more third couplings 117 each have a length measured in the first direction X and a width measured in the second direction Y. The length of each of the one of more third couplings 117 is equal to the width of each of the one or more third couplings 117. In some embodiments, the length of one or more of the third couplings 117 is greater than the width. In some embodiments, the width of one or more of the third couplings 117 is greater than the length. The third couplings 117 are at least on the third level. As such, the third couplings 117 are between the first layer 101 and the second layer 105. In some embodiments, the one or more third couplings 117 are vias. The one or more third couplings 117 are one or more of a metal or a polysilicon material.

In some embodiments, the first coupling 109, the second coupling 111 and/or the third coupling 117 couple the first layer 101 and/or the second layer 105 with an optional third layer 121. The third layer 121 is on a fourth level that is beneath the first layer 101. In some embodiments, the third layer 121 is over the first layer 101. In some embodiments, the third layer 121 is over the second layer 105. In other embodiments, the third layer 121 is below the second layer 105. In some embodiments, the third layer 121 is one or more of a metal or a polysilicon material.

Figure 2:
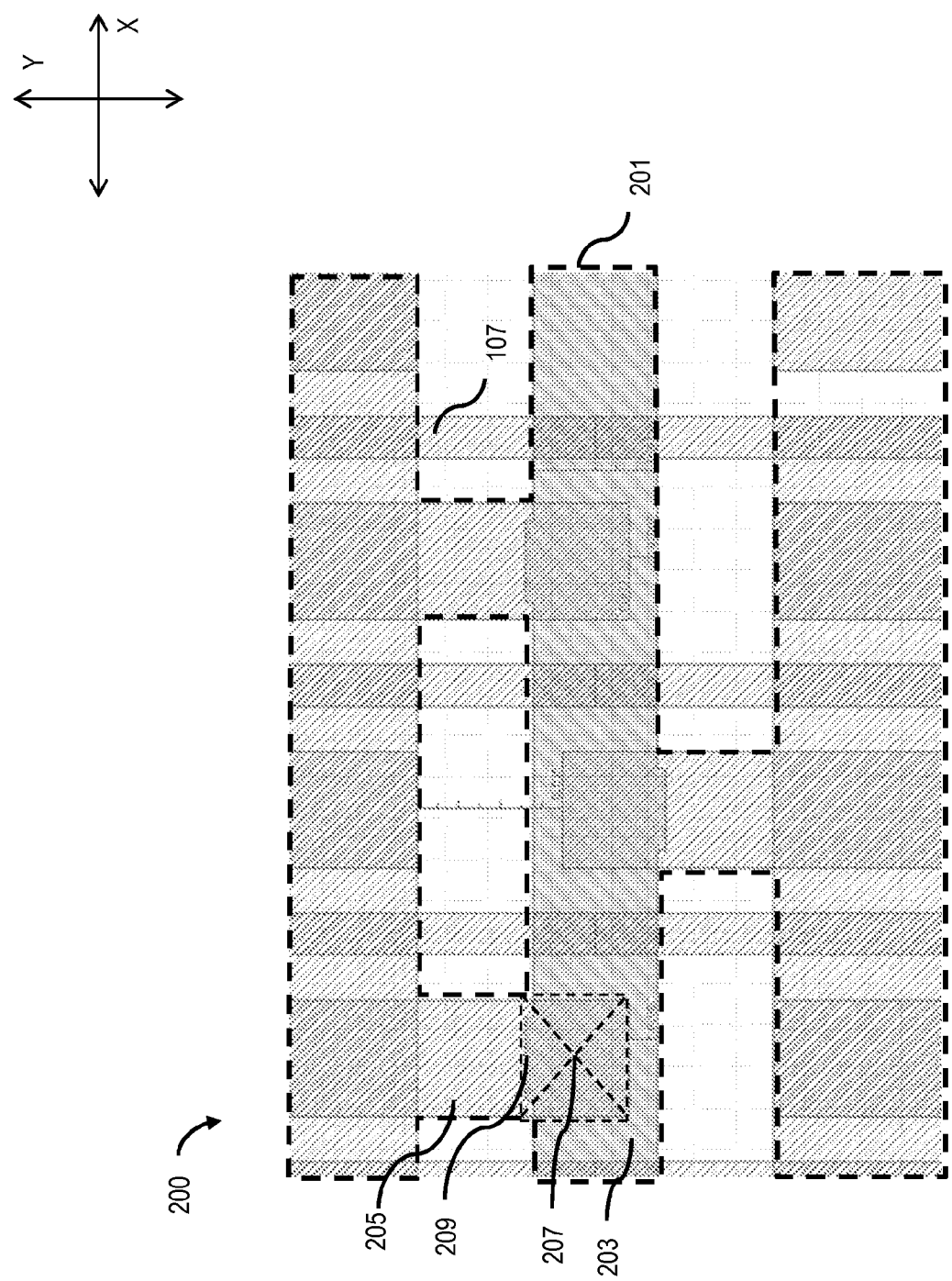
FIG. 2 is a plan view of an integrated circuit, in accordance with some embodiments.

FIG. 2 is a plan view of an integrated circuit 200, in accordance with one or more embodiments. A coupling 201 is similar to first coupling 109 (FIG. 1), second coupling 111 (FIG. 1), and third coupling 117 (FIG. 1), in that the coupling 201 connects the first layer 101 (FIG. 1) with the second layer 105 (FIG. 1), for example. Coupling 201, however, comprises multiple layers such that coupling 201 extends in the first direction X and the second direction Y. Coupling 201 includes first coupling lines 203 that are on a first coupling level and second coupling lines 205 that are on a second coupling level different from the first coupling level. First coupling lines 203 are similar to first lines 103 in that the first coupling lines 203 have a length in the first direction X that is greater than the pitch of the second lines 107 of second layer 105. The second coupling lines 205 have a length in the second direction Y. Second coupling lines 205 are between the second lines 107. In some embodiments, the second coupling lines 205 are below or above the second lines 107.

The first coupling lines 203 and the second coupling lines 205 overlap in various contact regions 207 such that the first coupling lines 203 are in contact with the second coupling lines 205. In some embodiments, the first coupling lines 203 are over the second coupling lines 205. In other embodiments, the second coupling lines 205 are over the first coupling lines 203.

The length of the first coupling lines 203 is greater than the width of the first coupling lines 203. First coupling lines 203 are similar to first lines 103 in that the first coupling lines 203 have a length in the first direction X that is greater than the pitch of the second lines 107 of second layer 105. The length of the second coupling lines 205 is greater than the width of the second coupling lines 205. Second coupling lines 205 are between the second lines 107 when viewed into the page, or orthogonally to the XY axis. In some embodiments, the second coupling lines 205 are on a different level compared to the second lines 107. In some embodiments, the second coupling lines are on the same level as the second lines 107. In some embodiments, the second coupling lines 205 are below or above the second lines 107 when viewed into the page. As such, the second coupling lines 205 are on a different level compared to the second lines 107.

The first coupling lines 203 have a jog-portion 209 that provides an extended width in the contact regions 207. The jog-portion 209 increases an amount of surface area of the first coupling lines 203 and the second coupling lines 205 that are in contact in the contact region 207. The increased surface area provided by the jog-portion 209 enhances electromigration performance and/or heat transfer capabilities of the coupling 201 in comparison with a coupling 201 that would have a contact region without the jog-portion 209.

The overlapping of the first coupling lines 203 with the second coupling lines 205 forms, for example, L-shaped, T-shaped, Z-shaped, U-shaped, rectangular-shaped couplings, or square-shaped couplings, another suitable shaped-coupling, or a combination thereof. The variously-shaped couplings make it possible to route couplings 201 in different directions, and to increase the space occupied by the couplings 201 which enhances electromigration performance and/or thermal conductivity performance of the integrated circuit 200.

In some embodiments, one or more of the first coupling 109 (FIG. 1), the second coupling 111 (FIG. 1) or the third couplings 117 (FIG. 1) are replaced with one or more couplings 201 that include the jog-portion 209. In some embodiments, one or more of the first coupling 109, the second coupling 111, or the third couplings 117 are replaced with one or more couplings 201 without the jog-portion 209.

Figure 3:
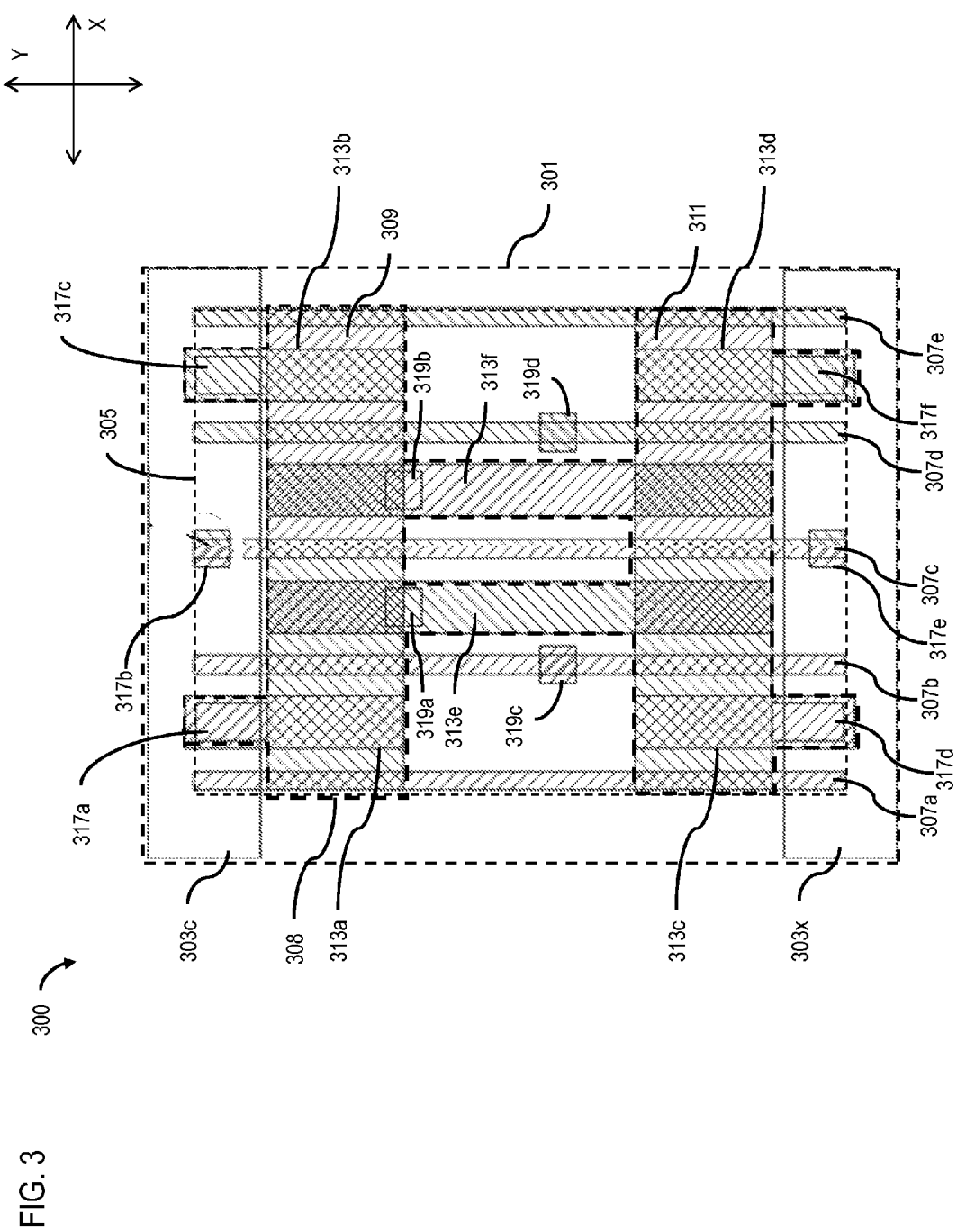
FIG. 3 is a plan view of an integrated circuit, in accordance with some embodiments.

FIG. 3 is a plan view of an integrated circuit 300, in accordance with one or more embodiments. Integrated circuit 300 includes features similar to those discussed with respect to integrated circuit 100 (FIG. 1) with the reference numerals increased by 200.

Integrated circuit 300 comprises first layer 301 that includes source power rail 303c and drain power rail 303x on a first level. Second layer 305 comprising one or more lines 307a-307e (collectively referred to as lines 307) is directly and indirectly coupled with the source power rail 303c and the drain power rail 303x by a coupling 308 that includes first coupling 309, second coupling 311, and coupling lines 313a-313f (collectively referred to as coupling lines 313); and third couplings 317a-317f (collectively referred to as third couplings 317 or first vias 317). The coupling 308 is similar to coupling 201 (FIG. 2) in that the coupling 308 includes coupling lines that overlap with one another. In some embodiments, the coupling 308 and/or the components thereof are vias.

The second layer 305 is on a second level different from the first level. In some embodiments, the second layer 305 is over the first layer 301. In some embodiments, first layer 301 is over second layer 305. The first coupling 309 and the second coupling 311 are on a third level different from the first level. In some embodiments, the third level is over the first level. In other embodiments, the first level is over the third level. In some embodiments, the first level is over the second level. In other embodiments, the second level is over the first level. The first coupling 309 and the second coupling 311 contact the lines 307. The coupling lines 313 are on the second level between the lines 307. The coupling lines 313 overlap with the first coupling 309 and the second coupling 311 similar to the first coupling lines 203 and the second coupling lines 205 discussed with respect to FIG. 2.

The coupling 308 is connected to the source power rail 303c and the drain power rail 303x by first vias 317a-317f (collectively referred to as first vias 317). Lines 307a, 307b, 307d, and 307e of the second layer 305 are indirectly coupled to the source power rail 303c and the drain power rail 303x by way of the coupling 308 and first vias 317a, 317c, 317d and 317f. Line 307c of the second layer 305 is coupled directly with the source power rail 303c and the drain power rail 303x by first vias 317b and 317e. Line 307c of the second layer 305 is coupled with the source power rail 303c and the drain power rail 303x by first vias 317b and 317e that are between the first vias 317a, 317c, 317d and 317f that indirectly couple lines 307a, 307b, 307d and 307e with the source power rail 303c and the drain power rail 303x.

Coupling at least one of the one or more lines 307 of the second layer 305 with the source power rail 303c and the drain power rail 303x renders the line 307, that is directly coupled with the source power rail 303c and the drain power rail 303x, a dummy line. The direct coupling of the line 307 with the source power rail 303c and the drain power rail 303x eliminates a need for having multiple dummy lines in the second layer 305 separated by a space. For example, if the integrated circuit 300 includes a first cell and an adjacent second cell defined by dummy lines that are on the borders of the first cell and the second cell, then the first cell and the second cell would be separated by a space between the dummy lines on the borders of the adjacent cells. But, because at least one of the one or more lines 307 of the second layer 305 is directly coupled with the source power rail 303c and the drain power rail 303x, an overall length and width of the integrated circuit 300 is reduced compared to an integrated circuit that would otherwise have multiple dummy lines or cells separated by a space.

The integrated circuit 300 includes second vias 319a-319d that couple the lines 307 and the coupling 308 with other features or layers (not shown) of the integrated circuit 300) at positions that border the line 307 that is directly coupled with the source power rail 303c and the drain power rail 303x.

Figure 4:
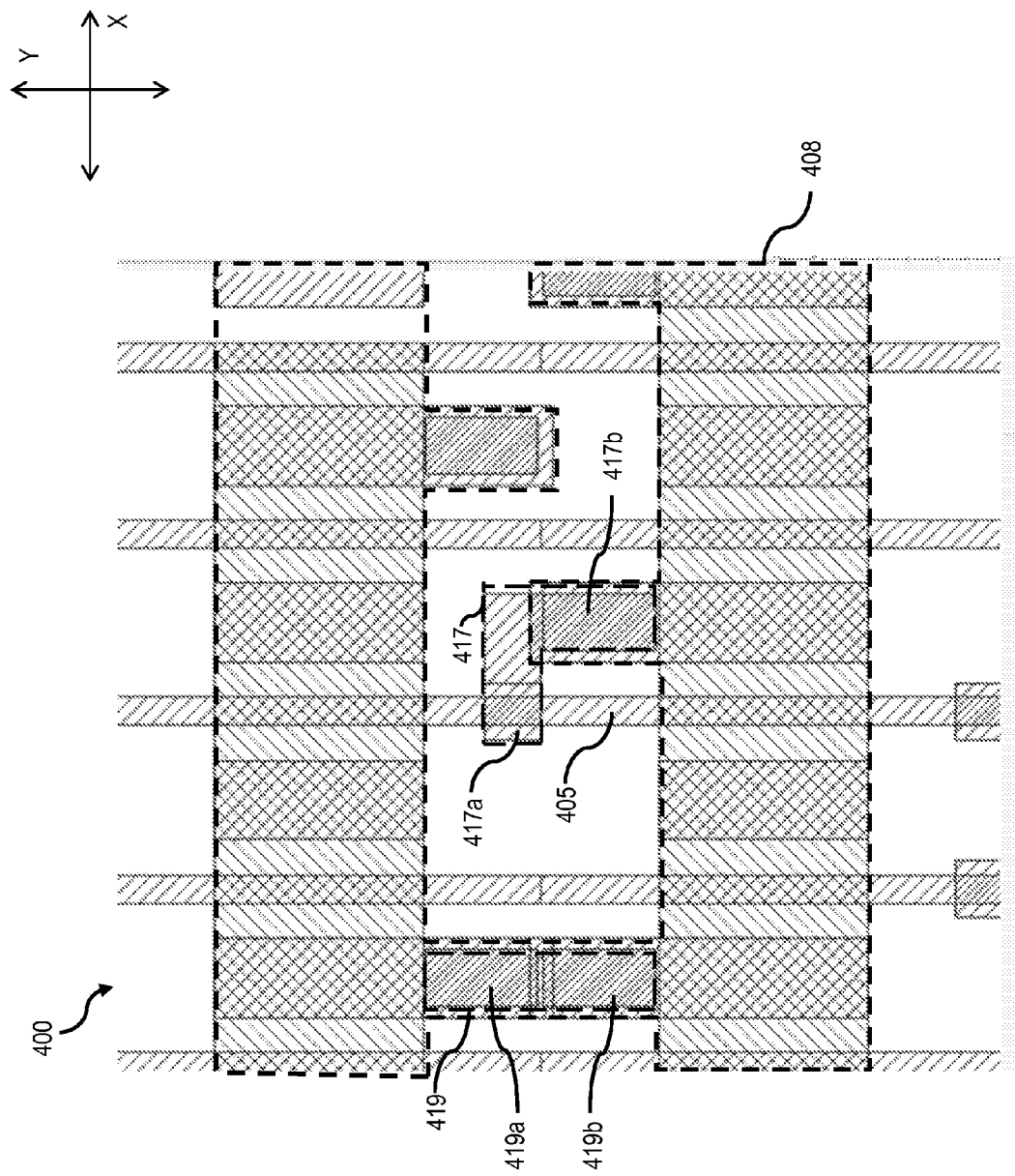
FIG. 4 is a plan view of an integrated circuit, in accordance with some embodiments.

FIG. 4 is a plan view of an integrated circuit 400, in accordance with one or more embodiments. Integrated circuit 400 includes features similar to those discussed with respect to integrated circuit 300 (FIG. 3), with the reference numerals increased by 100. Coupling 408 is coupled with the second layer 405 by an L-shaped first via 417 that comprises a horizontal portion 417a and a vertical portion 417b. L-shaped via 417 provides, for example, additional contact area between the coupling 408 and the second layer 405. Or, if the coupling 408 and the second layer 405 are in different layers and/or are not in contact with one another, the L-shaped via 417 makes it possible to couple the coupling 408 with the second layer 405. If the coupling 408 is bound by one or more design rules that dictate, for example, the direction that the coupling lines 313 (FIG. 3) are allowed to extend, the L-shaped via 417 is not bound by such design rules and, accordingly, makes it possible to connect the coupling 408 with the second layer 405, for example.

In some embodiments, horizontal portion 417a and vertical portion 417b of the L-shaped via 417 are a unitary formation in a same layer. In some embodiments, horizontal portion 417a and vertical portion 417b of the L-shaped via 417 are separately formed rectangular vias that are formed in a same layer. If separately formed in a same layer, horizontal portion 417a and the vertical portion 417b abut one another to form a conductive connection between one another. In some embodiments, horizontal portion 417a and vertical portion 417b of the L-shaped via 417 are separately formed rectangular vias in different layers. For example, if the horizontal portion 417a is in a layer beneath or over the vertical portion 417b, the L-shaped via 417 is formed in two separate layers that optionally comprise a same or a different material. In some embodiments, if the horizontal portion 417a is in a different layer from the vertical portion 417b, one of the horizontal portion 417a or the vertical portion 417b optionally comprises a polysilicon, or other suitable material, while the other of the horizontal portion 417a and the vertical portion 417b comprises a metal, or other suitable material. Alternatively, both the horizontal portion 417a and the vertical portion 417b comprise a metal, a polysilicon or other suitable material. If the horizontal portion 417a and the vertical portion 417b of the L-shaped via 417 are in different layers, the horizontal portion 417a and the vertical portion 417*b* overlap and contact one another to from a conductive connection between the horizontal portion 417*a* and the vertical portion 417*b*.

Similar to the L-shaped via 417, a via 419 comprises a first rectangular portion 419*a* and a second rectangular portion 419*b*. Via 419 couples coupling 408 with other features or layers (not shown) of the integrated circuit 400. In some embodiments, first rectangular portion 419*a* and second rectangular portion 419*b* of via 419 are a unitary formation in a same layer. In some embodiments, first rectangular portion 419*a* and second rectangular portion 419*b* of via 419 are separately formed rectangular vias that are formed in a same layer. If separately formed in a same layer, first rectangular portion 419*a* and second rectangular portion 419*b* of via 419 abut one another to form a conductive connection between one another. In some embodiments, h first rectangular portion 419*a* and second rectangular portion 419*b* of via 419 are separately formed rectangular vias in different layers. For example, if the first rectangular portion 419*a* is in a layer beneath or over the second rectangular portion 419*b*, via 419 is formed in two separate layers that optionally comprise a same or a different material. In some embodiments, if the first rectangular portion 419*a* is in a different layer from the second rectangular portion 419*b*, one of the first rectangular portion 419*a* or the second rectangular portion 419*b* of via 419 optionally comprises a polysilicon, or other suitable material, while the other of the first rectangular portion 419 a and second rectangular portion 419*b* of via 419 comprises a metal, or other suitable material. Alternatively, both the first rectangular portion 419 a and second rectangular portion 419*b* of via 419 comprise a metal, a polysilicon or other suitable material. If the first rectangular portion 419*a* and second rectangular portion 419*b* of via 419 are in different layers, the first rectangular portion 419 a and second rectangular portion 419*b* of via 419 overlap and contact one another to from a conductive connection between the first rectangular portion 419*a* and second rectangular portion 419*b* of via 419.

Figure 5:
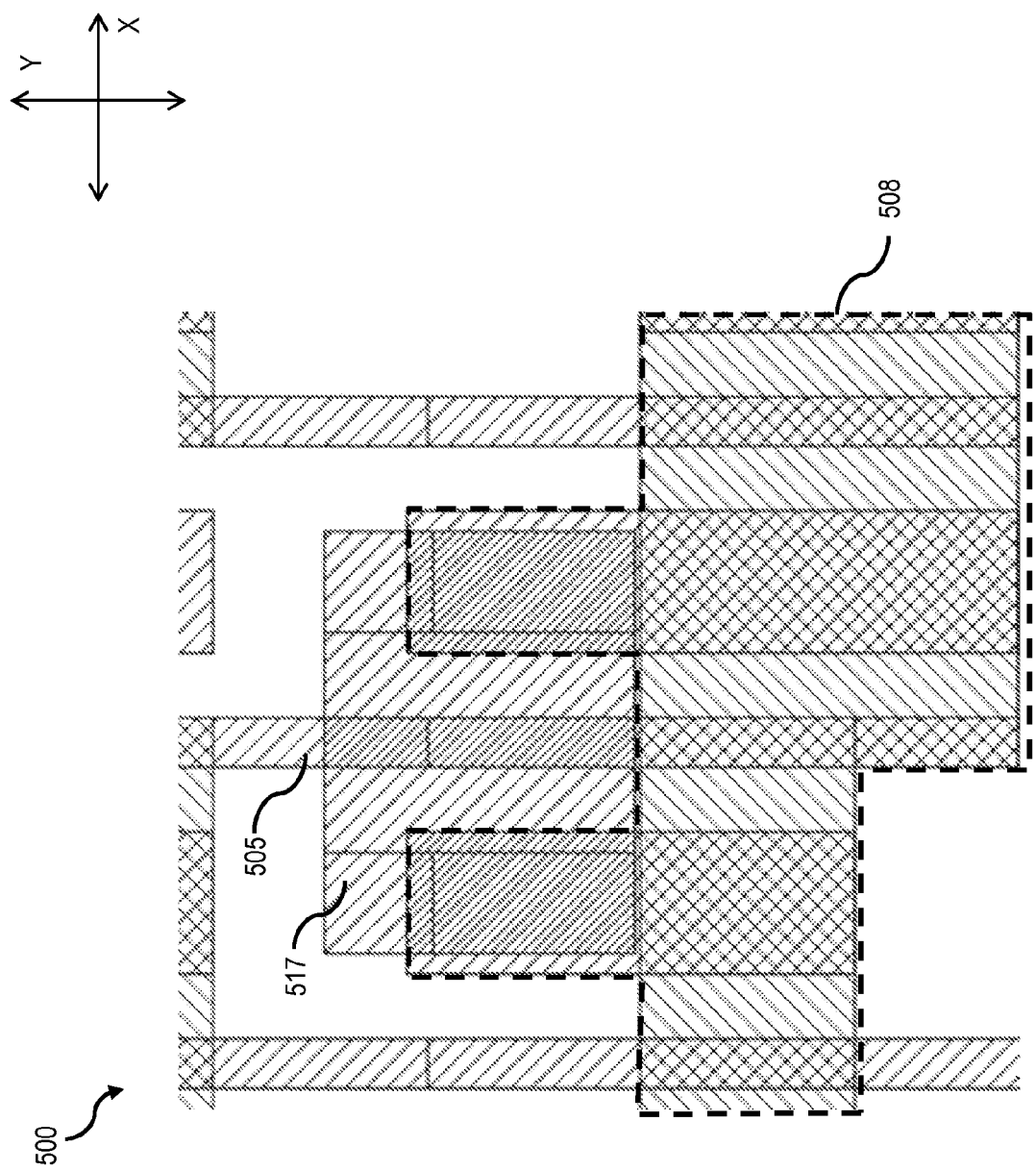
FIG. 5 is a plan view of an integrated circuit, in accordance with some embodiments.

FIG. 5 is a plan view of an integrated circuit 500, in accordance with one or more embodiments. Integrated circuit 500 includes features similar to those discussed with respect to integrated circuit 400 (FIG. 4), with the reference numerals increased by 100. Coupling 508 is coupled with the second layer 505 by a rectangular first via 517. Rectangular via 517 provides, for example, additional contact area between the coupling 508 and the second layer 505. Or, if the coupling 508 and the second layer 505 are in different layers and/or are not in contact with one another, the rectangular via 517 makes it possible to couple the coupling 508 with the second layer 505. If the coupling 508 is bound by one or more design rules that dictate, for example, the direction that the coupling lines 313 (FIG. 3) are allowed to extend, and a width of a line that extends in the design rule dictated direction, the rectangular via 517 is not bound by such design rules and, accordingly, makes it possible to connect the coupling 508 with the second layer 505, for example.

Figure 6:
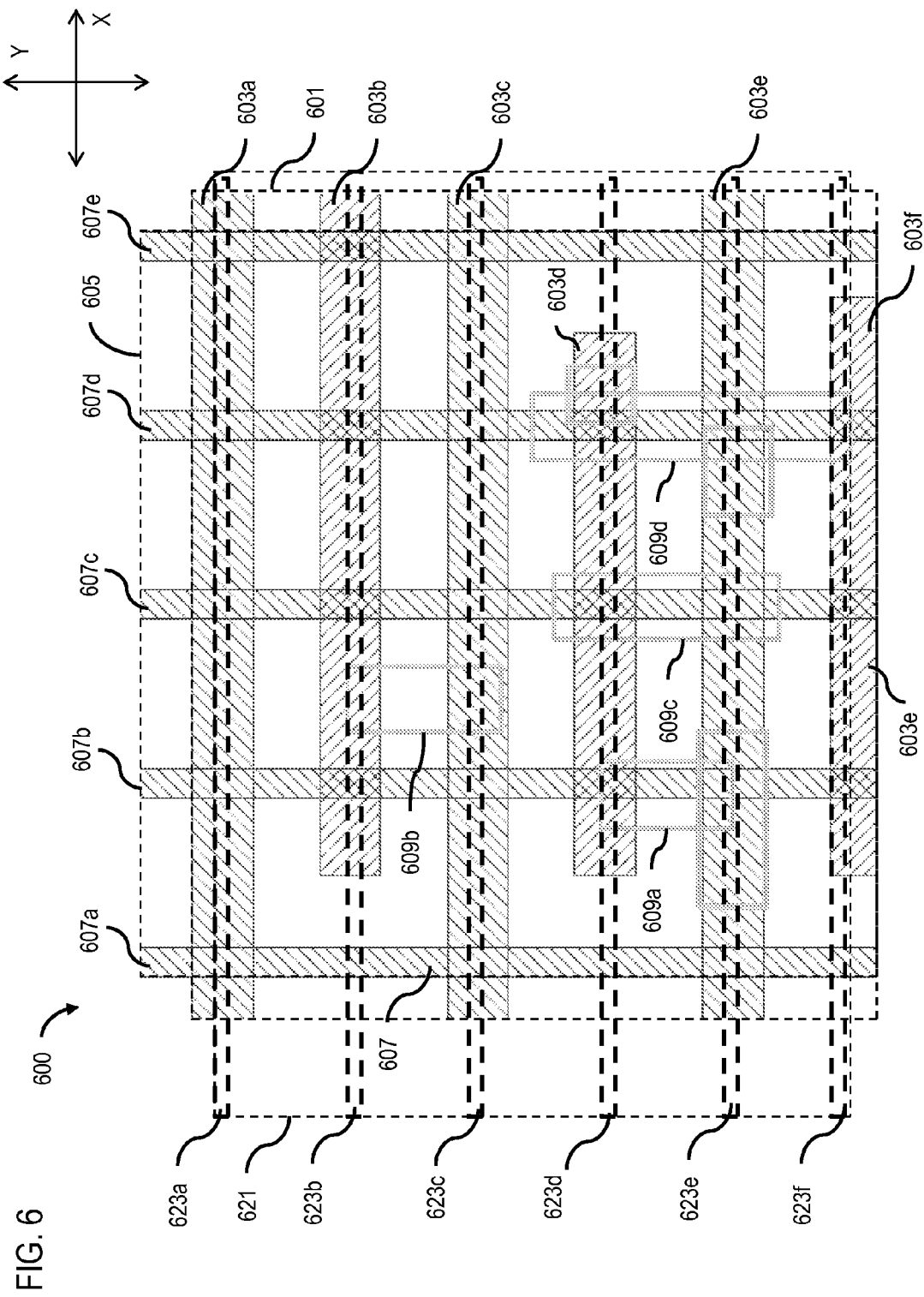
FIG. 6 is a plan view of an integrated circuit, in accordance with some embodiments.

FIG. 6 is a plan view of an integrated circuit 600, in accordance with one or more embodiments. Integrated circuit 600 includes features similar to those discussed with respect to integrated circuit 100 (FIG. 1) with the reference numerals increased by 500. Integrated circuit 600 includes a first layer 601 on a first level. The first layer comprises a set of first lines 603*a*-603*f* (collectively referred to as first lines 603). The first lines 603 each have a length measured in the first direction X and a width measured in the second direction Y. The length of each of the first lines 603 is greater than the width of each of the first lines 603.

A second layer 605 is on a second level different from the first level. In some embodiments, the first layer 601 is over the second layer 605. In other embodiments, the second layer 605 is over the first layer 601. In some embodiments, the second layer 605 is a polysilicon layer. The second layer 605 comprises a set of second lines 607*a*-607*e* (collectively referred to as second lines 607). The second lines 607 each have a length measured in the second direction Y and a width measured in the first direction X. The length of each of the second lines 607 is greater than the width of each of the second lines 607. The length and/or width of each of the second lines 607 is uniform. In some embodiments, the length and/or width of each of the second lines 607 varies among the second lines 607.

A third layer 621 is on a third level different from the first level. The third layer 621 comprises a set of third lines 623*a*-623*f* (collectively referred to as third lines 623). The third lines 623 each have a length measured in the first direction X and a width measured in the second direction Y. The length of each of the third lines 623 is greater than the width of each of the third lines 623. The first lines 603 extend parallel with the third lines 623.

One or more couplings 609*a*-609*d* (collectively referred to as couplings 609) connect at least one first line 603 of the set of first lines 603 with at least one other first line 603 of the set of first lines 603. The couplings 609 also connect at least one third line 623 of the set of third lines 623 with at least one other third line 623 of the set of third lines 623. As such, the couplings 609 comprise at least one layer on a level between the first layer 601 and the third layer 621.

The first lines 603 of the set of first lines 603 have a first pitch between the first lines 603 of the set of first lines 603. The third lines 623 of the set of third lines 623 have a second pitch between the third lines 623 of the set of third lines 623. The coupling 609 has a length measured in the second direction Y greater than or equal to the larger of the first pitch or the second pitch. In some embodiments, the couplings 609 are L-shaped, T-shaped, Z-shaped, U-shaped, rectangular-shaped couplings, or square-shaped couplings, another suitable shaped-coupling, or a combination thereof.

For example, coupling 609*a* is an L-shaped coupling that couples third line 623*d*, third line 623*e*, first line 603*d* and first line 603*e*. Coupling 609*b* is a rectangular-shaped coupling that couples third line 623*b*, third line 623*c*, first line 603*b* and first line 603*c*. Coupling 609*c* is a rectangular-shaped coupling that couples third line 623*d*, third line 623*e*, first line 603*d* and first line 603*e*. Coupling 609*d* is a Z-shaped coupling that couples third line 623*d*, third line 623*e*, third line 623*f*, first line 603*d*, first line 603*e*, and first line 603*f*.

In some embodiments, the first layer 601 and the third layer 621 are metal comprising conductive layers, and the second layer 605 is a polysilicon comprising layer. The first layer 601 is bound by a first design rule limiting the length to width relationship of the first lines 603. The second layer 605 is bound by a second design rule limiting the length to width relationship of the second lines 607. The third layer 621 is bound by a third designed rule limiting the length to width relationship of the third lines 623. The couplings 609 are free from the first design rule, the second design rule and the third design rule. In some embodiments, the first layer 601, the second layer 605 and/or the third layer 621 are designed or manufactured in compliance with one-direction (1 D) design rules that limit the direction in which a layer or line within a layer is allowed to extend. The couplings 609, however, are free from such design rule limitations. The couplings 609, therefore, are allowed to be routed in one or more of the first direction X or the second direction Y.

Figure 7:
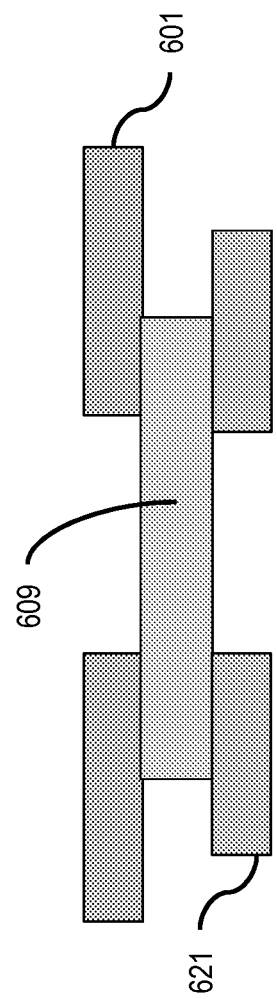
FIG. 7 is a cross-section view of an integrated circuit, in accordance with some embodiments.

FIG. 7 is a cross-section view of the integrated circuit 600 (FIG. 6), in accordance with one or more embodiments. The first layer 601 is over the third layer 621. A coupling 609 is between the first layer 601 and the third layer 621.

An aspect of this description relates to an integrated circuit comprises a first layer on a first level. The first layer comprises a set of first lines. The lines of the set of first lines each have a length measured in a first direction and a width measured in a second direction different from the first direction. The length of each of the lines of the set of first lines is greater than the width of each of the lines of the set of first lines. The integrated circuit also comprises a second layer on a second level different from the first level. The second layer comprises a set of second lines. The lines of the set of second lines each have a length measured in the second direction and a width measured in the first direction. The length of each of the lines of the set of second lines is greater than the width of each of the lines of the set of second lines. The integrated circuit further comprises a first coupling configured to connect at least one line of the set of first lines with at least one line of the set of second lines. The first coupling has a length measured in the first direction and a width measured in the second direction. The set of second lines has a pitch measured between the lines of the set of second lines in the first direction. The length of the first coupling is greater than or equal to the pitch.

Another aspect of this description relates to an integrated circuit comprising a power line on a first level, and a first layer coupled with the power line. The first layer is on a second level different from the first level. The integrated circuit also comprises a second layer having one or more lines coupled with the power line. The second layer is on a third level different from the first level. The integrated circuit further comprises at least one first via configured to couple the first layer with the power line. The integrated circuit additionally comprises at least one second via configured to couple the one or more lines of the second layer with the power line.

A further aspect of this description relates to an integrated circuit comprising a first layer on a first level. The first layer comprises a set of first lines. The lines of the set of first lines each have a length measured in a first direction and a width measured in a second direction different from the first direction. The length of each of the lines of the set of first lines is greater than the width of each of the first lines. The integrated circuit also comprises a second layer on a second level different from the first level. The second layer comprises a set of second lines. The lines of the set of second lines each have a length measured in the first direction and a width measured in the second direction. The length of each of the lines of the set of second lines is greater than the width of each of the lines of the set of second lines. The integrated circuit further comprises a coupling configured to connect at least one line of the set of first lines with at least one other line of the set of first lines, and to connect at least one line of the set of second lines with at least one other line of the set of second lines.

One general aspect of embodiments disclosed herein includes an integrated circuit, including: a first layer on a first level, the first layer including a set of first lines, at least one line of the set of first lines being a source power rail and at least one other line of the set of first lines being a drain power rail, the lines of the set of first lines each having a length measured in a first direction and a width measured in a second direction different from the first direction, wherein the length of each line of the set of first lines is different from the width of each line of the set of first lines; a second layer on a second level different from the first level, the second layer comprising a set of second lines, the lines of the set of second lines each having a length measured in the second direction and a width measured in the first direction, and the set of second lines having a distance between each of the lines of the set of second lines in the first direction; a first coupling on a third level different from the first level and the second level, the first coupling in direct contact with the source power rail, the first coupling configured to electrically connect at least one line of the set of first lines with at least one line of the set of second lines, the first coupling having a length measured in the first direction and a width measured in the second direction; and a second coupling on the third level, the second coupling configured to electrically connect at least one other line of the set of first lines with the at least one line of the set of second lines, the second coupling having a length measured in the first direction and a width measured in the second direction, the length of the first coupling and the second coupling being greater than or equal to the distance between each of the lines of the set of second lines.

Another general aspect of embodiments disclosed herein includes an integrated circuit, including: a first layer of conductive segments, the first layer being in a first plane, each having an elongated axis extending in a first direction; a second layer of conductive segments being in a second plane vertically displaced from the first plane, each conductive segment of the second layer of conductive segment having an elongated axis extending in a second direction orthogonal to the first direction; a first coupling extending from the first plane to the second plane, the first coupling having at least one elongated axis extending along the first direction and being in electrical and physical contact with at least one conductive segment of the first layer of conductive segments and with a first subset of conductive segments of the second layer of conductive segments, the first coupling having a length in the first direction that is greater than a spacing in the first direction between adjacent conductive segments of the second layer of conductive segments; and a second coupling extending from the first plane to the second plane, the second coupling having at least one elongated axis extending along the first direction and being in electrical and physical contact with at least one other conductive segment of the first layer of conductive segments and with a second subset of conductive segments of the second layer of conductive segments the second coupling having a length in the first direction that is greater than the spacing in the first direction between adjacent conductive segments of the second layer of conductive segments.

Yet another general aspect of embodiments disclosed herein includes an integrated circuit, including: a source power line on a first plane; a first layer on a second plane different from the first plane; a second layer having one or more lines, the second layer being on a third plane different from the first plane; at least one first coupling electrically connecting the first layer with the source power line; at least one second coupling electrically connecting the one or more lines of the second layer with the source power line; and a drain power line electrically connected to the first layer one of the at least one first coupling, and electrically connected to the one or more lines of the second layer by one of the at least one second coupling.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first layer on a first level, the first layer comprising a set of first lines, at least one line of the set of first lines being a source power rail and at least one other line of the set of first lines being a drain power rail, the lines of the set of first lines each having a length measured in a first direction and a width measured in a second direction different from the first direction, wherein the length of each line of the set of first lines is different from the width of each line of the set of first lines;
a second layer on a second level different from the first level, the second layer comprising a set of second lines, the lines of the set of second lines each having a length measured in the second direction and a width measured in the first direction, and the set of second lines having a distance between each of the lines of the set of second lines in the first direction;
a first coupling on a third level different from the first level and the second level, the first coupling in direct contact with the source power rail, the first coupling configured to electrically connect at least one line of the set of first lines with at least one line of the set of second lines, the first coupling having a length measured in the first direction and a width measured in the second direction; and
a second coupling on the third level, the second coupling configured to electrically connect at least one other line of the set of first lines with the at least one line of the set of second lines, the second coupling having a length measured in the first direction and a width measured in the second direction, the length of the first coupling and the second coupling being greater than or equal to the distance between each of the lines of the set of second lines.

2. The integrated circuit of claim 1, wherein the first set of lines comprise metal.

3. The integrated circuit of claim 1, wherein the lines of the set of second lines comprise polysilicon.

4. The integrated circuit of claim 1, wherein the lines of the set of second lines includes a leftmost second line and a rightmost second line and wherein the first coupling extends unbroken from over the leftmost second line to over the rightmost second line.

5. The integrated circuit of claim 1, wherein the lines of the set of second lines includes a leftmost second line and a rightmost second line and wherein the first coupling extends as a series of discrete segments from over the leftmost second line to over the rightmost second line, each discrete segment of the series of discrete segments having a length that is greater than or equal to the distance between each of the lines of the set of second lines.

6. The integrated circuit of claim 1, wherein the width of the first coupling is the same as the width of the second coupling.

7. The integrated circuit of claim 1, wherein the first coupling, the second coupling, or both, comprises multiple layers such that the first coupling, the second coupling, or both includes first coupling lines extending in the first direction, second coupling lines vertically displaced from the first coupling lines and extending in the second direction, and vertically extending contact regions electrically connecting respective first coupling lines and second coupling lines.

8. The integrated circuit of claim 7, wherein the first coupling lines have a length in the first direction that is greater than the distance between each of the lines of the set of second lines.

9. The integrated circuit of claim 8, wherein at least one second coupling line is between two second lines.

10. An integrated circuit, comprising:
a first layer of conductive segments, the first layer being in a first plane, each having an elongated axis extending in a first direction;
a second layer of conductive segments being in a second plane vertically displaced from the first plane, each conductive segment of the second layer of conductive segment having an elongated axis extending in a second direction orthogonal to the first direction;
a first coupling extending from the first plane to the second plane, the first coupling having at least one elongated axis extending along the first direction and being in electrical and physical contact with at least one conductive segment of the first layer of conductive segments and with a first subset of conductive segments of the second layer of conductive segments, the first coupling having a length in the first direction that is greater than a spacing in the first direction between adjacent conductive segments of the second layer of conductive segments; and
a second coupling extending from the first plane to the second plane, the second coupling having at least one elongated axis extending along the first direction and being in electrical and physical contact with at least one other conductive segment of the first layer of conductive segments and with a second subset of conductive segments of the second layer of conductive segments, the second coupling having a length in the first direction that is greater than the spacing in the first direction between adjacent conductive segments of the second layer of conductive segments.

11. The integrated circuit of claim 10, wherein the first layer of conductive segments comprise metal structures and the second layer of conductive segments comprise polysilicon structures.

12. The integrated circuit of claim 10, wherein the at least one conductive segment of the first layer of conductive segments is a drain power rail and the at least one other conductive segment of the first layer of conductive segments is a source power rail.

13. The integrated circuit of claim 10, wherein the first layer of conductive segments further includes at least one additional conductive segment, and further comprising:
a third coupling configured to electrically connect the at least one additional conductive segment with at least one conductive segment of the second layer of conductive segments, the third coupling having a length measured in the first direction and a width measured in the second direction, wherein the length of the third coupling is equal to the width the third coupling.

14. The integrated circuit of claim 10, wherein the first coupling comprises at least one contact region, and the first coupling has an extended width in the contact region.

15. The integrated circuit of claim 10, wherein the first coupling includes a jog portion that increases an amount of surface area between the first coupling and the at least one conductive segment of the first layer of conductive segments, relative to a first coupling that does not have the jog portion.

16. An integrated circuit, comprising:
a source power line on a first plane;
a first layer on a second plane different from the first plane, the first layer having one or more lines comprising metal or polysilicon;
a second layer having one or more lines, the second layer being on a third plane different from the first plane;
at least one first coupling electrically connecting the first layer with the source power line;
at least one second coupling electrically connecting the one or more lines of the second layer with the source power line; and
a drain power line electrically connected to the first layer by one of the at least one first coupling, and electrically connected to the one or more lines of the second layer by one of the at least one second coupling.

17. The integrated circuit of claim 16, wherein the first layer is electrically connected to the source power line by two first couplings, the first layer is electrically connected to the drain power line by two other first couplings, and the one or more lines of the second layer is electrically connected to the source power line and the drain power line by second couplings between the first couplings electrically connected to the first layer with the source power line and the drain power line.

18. The integrated circuit of claim 16, wherein the at least one first coupling includes a jog portion that increases an amount of surface area between the first coupling and at least one conductive segment of the first layer, relative to a first coupling that does not have the jog portion.

19. The integrated circuit of claim 16, wherein the first layer is coupled with the second layer by at least one rectangular via.

20. The integrated circuit of claim 16, wherein the first layer comprises a metal and the second layer comprises a polysilicon.

* * * * *